US012765217B2

(12) United States Patent
Yao et al.

(10) Patent No.: US 12,765,217 B2
(45) Date of Patent: Oct. 13, 2026

(54) DISPLAY PANEL AND DISPLAY DEVICE

(71) Applicants: Hefei Visionox Technology Co., Ltd., Hefei (CN); KunShan Go-Visionox Opto-Electronics Co., Ltd., Kunshan (CN)

(72) Inventors: Yuan Yao, Hefei (CN); Lanfen Lv, Hefei (CN); Liusong Ni, Hefei (CN); Xiaoyu Wang, Hefei (CN); Zhengkui Dong, Hefei (CN); Lipeng Gao, Hefei (CN); Mingchen Li, Hefei (CN)

(73) Assignees: Hefei Visionox Technology Co., Ltd., Hefei (CN); KunShan Go-Vision Opto-Electronics Co., Ltd., Kunshan (CN)

( * ) Notice: Subject to any disclaimer, the term of this patent is extended or adjusted under 35 U.S.C. 154(b) by 310 days.

(21) Appl. No.: 18/752,829

(22) Filed: Jun. 25, 2024

(65) Prior Publication Data

US 2025/0081793 A1 Mar. 6, 2025

Related U.S. Application Data

(63) Continuation of application No. PCT/CN2024/085240, filed on Apr. 1, 2024.

(30) Foreign Application Priority Data

Aug. 30, 2023 (CN) .......................... 202311110881.8

(51) Int. Cl.
*H10K 59/40* (2023.01)
*G06F 3/041* (2006.01)
(Continued)

(52) U.S. Cl.
CPC ........... *H10K 59/40* (2023.02); *G06F 3/0412* (2013.01); *G06F 3/0443* (2019.05);
(Continued)

(58) Field of Classification Search
CPC .... G06F 3/0412; G06F 3/0446; G06F 3/0443; G06F 3/04164; G06F 3/0448;
(Continued)

(56) References Cited

U.S. PATENT DOCUMENTS

2019/0064960 A1* 2/2019 Na ........................ G06F 3/0446
2019/0377438 A1* 12/2019 Kim ...................... G06F 3/0412
(Continued)

FOREIGN PATENT DOCUMENTS

CN 108334825 A 7/2018
CN 111029390 A 4/2020
(Continued)

OTHER PUBLICATIONS

International Search Report and Written Opinion issued in corresponding PCT Application No. PCT/CN2024/085240 dated Apr. 29, 2024.

*Primary Examiner* — Dong Hui Liang
(74) *Attorney, Agent, or Firm* — Kilpatrick Townsend & Stockton LLP

(57) ABSTRACT

Disclosed are a display panel and a display device. The display panel includes a display area, with at least one first area. The display panel further includes a substrate, and a display function layer, an isolation structure, and a touch structure. The display function layer includes a plurality of light-emitting devices. The isolation structure includes a plurality of first openings and second openings. The plurality of second openings are located in the first area, and the first opening is configured to define the light-emitting device. The touch structure includes a dummy electrode, and an orthographic projection of at least one second opening on the substrate is located within an orthographic projection of the dummy electrode on the substrate. A risk of interference between a driving signal for touch and a driving signal for
(Continued)

display may be reduced, so as to ensure touch and display functions of the display panel.

20 Claims, 7 Drawing Sheets

(51) Int. Cl.

| | |
|---|---|
| ***G06F 3/044*** | (2006.01) |
| ***H10K 59/122*** | (2023.01) |
| ***H10K 59/80*** | (2023.01) |
| ***H10K 59/88*** | (2023.01) |

(52) U.S. Cl.
CPC ......... *G06F 3/0446* (2019.05); *H10K 59/122* (2023.02); *H10K 59/8731* (2023.02); *H10K 59/88* (2023.02)

(58) Field of Classification Search
CPC ................... G06F 3/044; G06F 3/0445; G06F 2203/04112; G06F 2203/04111; H10K 59/40; H10K 59/122; H10K 59/12; H10K 59/88; H10K 2102/311
See application file for complete search history.

(56) References Cited

U.S. PATENT DOCUMENTS

| | | | | |
|---|---|---|---|---|
| 2020/0293150 | A1* | 9/2020 | Jeong | G06F 3/0446 |
| 2022/0187951 | A1* | 6/2022 | Chen | G06F 3/0446 |
| 2022/0392962 | A1* | 12/2022 | Park | G06F 3/0412 |
| 2022/0392991 | A1* | 12/2022 | Woo | H10K 59/131 |
| 2023/0341985 | A1* | 10/2023 | Lee | G06F 3/0446 |

FOREIGN PATENT DOCUMENTS

| | | | |
|---|---|---|---|
| CN | 112820767 | A | 5/2021 |
| CN | 114924661 | A | 8/2022 |
| CN | 114975555 | A | 8/2022 |
| CN | 115148773 | A | 10/2022 |
| CN | 116266082 | A | 6/2023 |
| CN | 116583155 | A | 8/2023 |
| WO | 2023142048 | A1 | 8/2023 |

* cited by examiner

DISPLAY PANEL AND DISPLAY DEVICE

CROSS-REFERENCE TO RELATED APPLICATIONS

This application is continuation of International Application No. PCT/CN2024/085240, filed on Apr. 1, 2024, which claims priority to Chinese Patent Application No. 202311110881.8, filed on Aug. 30, 2023. Both of the aforementioned applications are hereby incorporated by reference in their entireties.

TECHNICAL FIELD

Embodiments of the present disclosure relate to the field of display technologies, and in particular, to a display panel and a display device.

BACKGROUND

An organic light-emitting diode (OLED) is an organic thin-film electroluminescent device. Due to advantages of simple fabrication process, low cost, low power consumption, high brightness, wide viewing angles, high contrast, and the ability to achieve flexible displays, the organic light-emitting diode device has attracted significant attention and is widely used in electronic display products.

However, currently, electronic display products are limited to a design of their own structure, making it difficult to simultaneously achieve excellent touch control and display functions.

SUMMARY

A first aspect of the present disclosure provides a display panel including a display area. The display area includes at least one first area. In addition, the display panel further includes a substrate, a display function layer, an isolation structure and a touch structure located on the substrate. The display function layer includes a plurality of light-emitting devices. The isolation structure is located in the display area, and includes a plurality of first openings and a plurality of second openings. The first opening is configured to define the light-emitting device. The touch structure is located on a side, facing away from the substrate, of the isolation structure and includes a touch electrode. The touch electrode includes a dummy electrode, and an orthographic projection of at least one of the second openings on the substrate is located within an orthographic projection of the dummy electrode on the substrate.

According to the solution mentioned above, the second opening for light transmission is arranged below the dummy electrode, so that a risk of interference between a touch signal and a display signal in the substrate may be reduced, thereby ensuring touch and display functions of the display panel.

The first aspect of the present disclosure further provides a display panel, including a display area, and the display area includes at least one first area. The display panel includes: a substrate; a display function layer, located on the substrate and including a plurality of light-emitting devices; an isolation structure, located on the substrate and located in the display area, where the isolation structure includes a plurality of first openings and a plurality of second openings, the plurality of second openings are located in the first area, and the first opening is configured to define the light-emitting device; and a touch structure, located on a side, facing away from the substrate, of the isolation structure and including a touch electrode, where the touch electrode includes a dummy electrode, and an orthographic projection of at least one of the second openings on the substrate is located within an orthographic projection of an outer boundary of the dummy electrode on the substrate.

The first aspect of the present disclosure further provides a display panel, including a display area, and the display area includes at least one first area. The display panel includes: a substrate; a display function layer, located on the substrate and including a plurality of light-emitting devices; an isolation structure, located on the substrate and located in the display area, where the isolation structure includes a plurality of first openings and a plurality of second openings, the plurality of second openings are located in the first area, and the first opening defines the light-emitting device; and a touch structure, located on a side, facing away from the substrate, of the isolation structure and including a touch electrode, where the touch electrode includes a dummy electrode, and an orthographic projection of the first area on the substrate overlaps with an orthographic projection of the dummy electrode on the substrate.

A second aspect of the present disclosure provides a display device, and the display device may include the display panel in the first aspect.

DETAILED DESCRIPTION OF THE EMBODIMENTS

Figure 1:
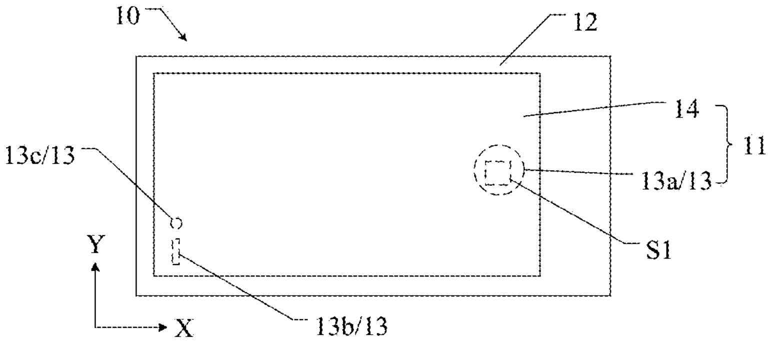
FIG. 1 is a plane schematic structural diagram of a display panel according to an embodiment of the present disclosure.

Technical solutions in embodiments of the present disclosure will be clearly and completely described with reference to accompanying drawings corresponding to the embodiments of the present disclosure in the following description. Apparently, the described embodiments are only some, not all, embodiments of the present disclosure. Based on the embodiments in the present disclosure, all other embodiments obtained by those skilled in the art without creative efforts shall fall within the protection scope of the present disclosure.

A display panel may achieve functions of transparent display and under-screen recognition (e.g., fingerprint recognition, under-screen shooting and infrared ranging), and touch function simultaneously. A light-transmitting area of the display panel may be divided, and light-transmitting holes are placed at interstices of sub-pixels in the light-transmitting area to achieve transparency. However, in an area where the light-transmitting holes are located, there might be signal interference between a conductive structure used for touch function (e.g., the touch electrodes mentioned below) and a lower-level metal wiring or driving circuit (e.g., a driving circuit in the substrate mentioned below), potentially leading to malfunction of touch or display functions.

At least one embodiment of the present disclosure provides a display panel to at least solve the technical problem mentioned above. The display panel includes a display area, and the display area includes at least one first area. In addition, the display panel further includes a substrate, and a display function layer, an isolation structure, and a touch structure located on the substrate. The display function layer is located on the substrate and includes a plurality of light-emitting devices. The isolation structure is located on the substrate and located in the display area. The isolation structure includes a plurality of first openings and a plurality of second openings, the plurality of second openings are located in the first area, and the first opening is configured to define the light-emitting device. The touch structure is located on a side, facing away from the substrate, of the isolation structure and includes a touch electrode. The touch electrode includes a dummy electrode. An orthographic projection of at least one of the second openings on the substrate is located within an orthographic projection of the dummy electrode on the substrate. Thus, the second opening for light transmission is arranged below the dummy electrode, so that a risk of interference between a touch signal and a display signal in the substrate may be reduced to ensure touch and display functions of the display panel.

In the following, a structure of a display panel and a display device in at least one embodiment of the present disclosure is described in detail with reference to the accompanying drawings. In addition, in the accompanying drawings, a spatial Cartesian coordinate system is established based on the substrate of the display panel as a reference, so as to visually present a positional relationship of various elements in the display panel. In the spatial Cartesian coordinate system, an X-axis and a Y-axis are parallel to a plane where the substrate is located, and a Z-axis is perpendicular to the plane where the substrate is located.

Figure 2:
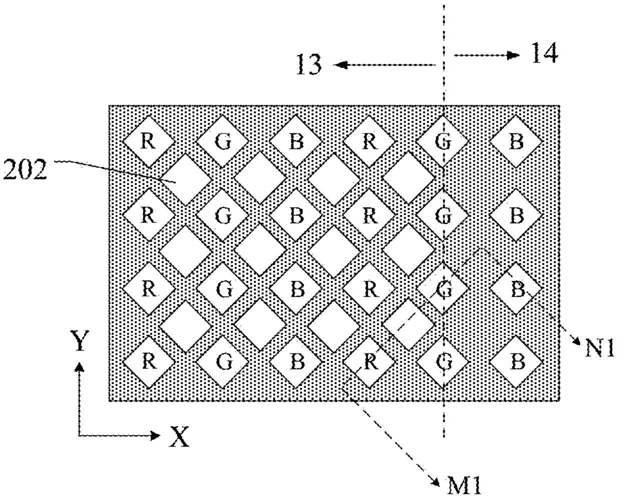
FIG. 2 is an enlarged view of an area S1 of the display panel shown in FIG. 1 according to a design, illustrating a planar design of an isolation structure in the display panel.
Figure 3:
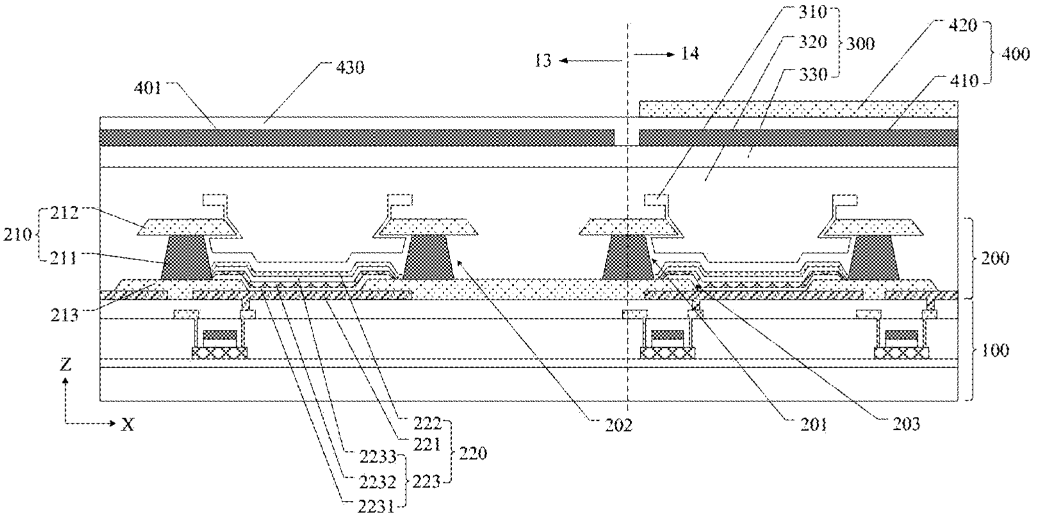
FIG. 3 is a cross-sectional view of the display panel along M1-N1 shown in FIG. 2 according to a design.
Figure 4:
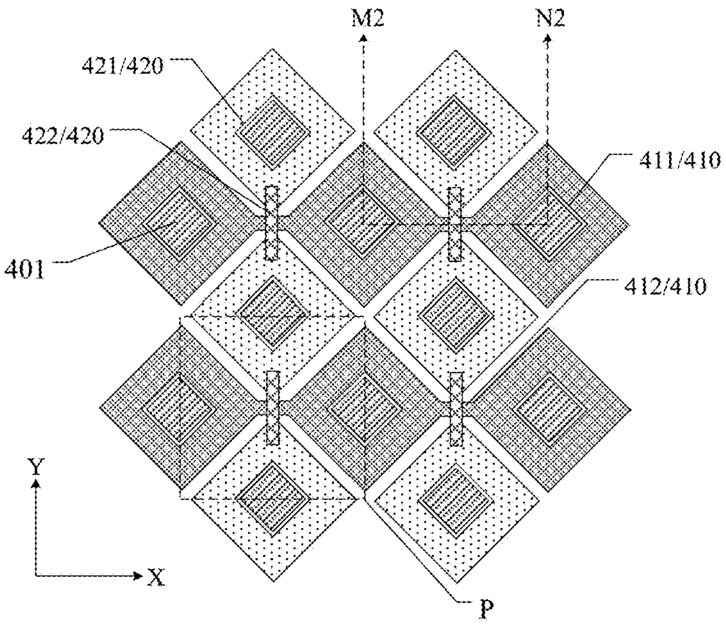
FIG. 4 is a plane schematic structural diagram of a touch electrode layer in a display panel according to an embodiment of the present disclosure.
Figure 5:
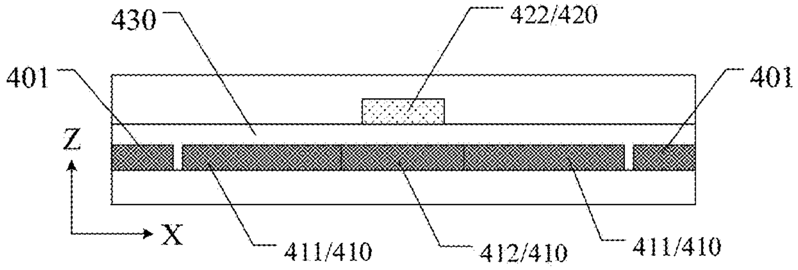
FIG. 5 is a cross-sectional view of the touch electrode along M2-N2 shown in FIG. 4.
Figure 6:
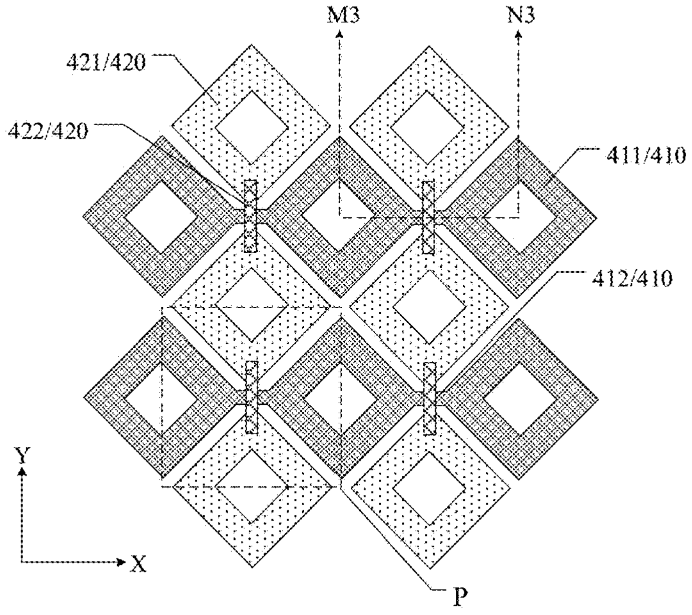
FIG. 6 is a plane schematic structural diagram of the touch electrode shown in FIG. 4 without considering a dummy electrode.
Figure 7:
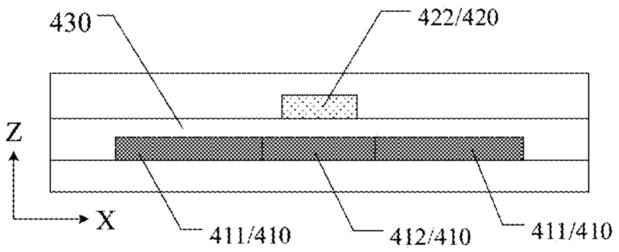
FIG. 7 is a cross-sectional view of the touch electrode layer along M3-N3 shown in FIG. 6.

As shown in FIGS. 1 to 3, a display area 11 includes a display panel 10 and a frame area 12 surrounding the display area 11. The display area 11 includes a first area 13, and sub-pixels (of which physical structures are light-emitting devices 220), such as R, G, and B are arranged in the display area 11. The first area 13 is designed to have a certain light transmittance for under-screen recognition, camera shooting or transparent display. In some embodiments of the present disclosure, a part of wiring in the frame area 12 may be arranged in the display area 11, so that the frame area 12 may be designed as a single-sided frame.

At least one first area 13 is provided in the display area 11. For example, three areas 13*a*, 13*b*, and 13*c* may be provided as shown in FIG. 1. The three areas may be used for different functions. For example, the area 13*a* may be used for under-screen fingerprint recognition, and the area 13*c* may be used for infrared ranging.

A physical structure of the display panel 10 may include a substrate 100, and a display function layer 200, an isolation structure 210, and a touch structure (of which a touch electrode 400 is shown in figures) located on the substrate 100.

The display function layer 200 is located on the substrate 100 and includes a plurality of light-emitting devices 220 located in the display area 11. The isolation structure 210 is located on the substrate 100 and located in the display area 11. The isolation structure 210 includes a plurality of first openings 201 and a plurality of second openings 202, the plurality of second openings 202 are located in the first area 13, and the first opening 201 is configured to define the light-emitting device 220. The touch structure is located on a side, facing away from the substrate 100, of the isolation structure 210 and includes a touch electrode 400. The touch electrode 400 includes a dummy electrode 401. An orthographic projection of at least one of the second openings 202 on the substrate 100 is located within an orthographic projection of the dummy electrode 401 on the substrate 100.

The dummy electrode is configured to optimize a pattern of the touch electrode, so as to adjust a load thereof and an electric field distribution during driving. Therefore, in a case where the dummy electrode is disposed in the touch electrode, the dummy electrode exists independently without being connected to other electrodes in the touch electrode, that is, when the touch electrode is applied with a driving signal (voltage), the driving signal is not applied to the dummy electrode. Thus, even if an area where the dummy electrode is located overlaps with the second opening for light transmission, the dummy electrode does not interfere with a driving circuit in the substrate through the second opening.

For example, as shown in FIGS. 1 to 3, the light-emitting device 220 includes a first electrode 221, a light-emitting function layer 223, and a second electrode 222 sequentially stacked on the substrate 100, and the light-emitting function layer 223 is located in the first opening 201. The light-emitting function layer 223 may include a first common layer 2231, a light-emitting layer 2232, and a second common layer 2233. The first common layer 2231, the light-emitting layer 2232, and the second common layer 2233 are sequentially stacked on the first electrode 221. The first common layer 2231 may include a hole injection layer, a hole transport layer, an electron blocking layer, and the like. The second common layer 2232 may include an electron injection layer, an electron transport layer, a hole blocking layer, and the like. Arrangement of the isolation structure 210 enables that the first common layer 2231 (a main film layer causing current crosstalk) of each light-emitting device 220 is electrically disconnected from each other.

For example, as shown in FIGS. 1 to 3, the isolation structure 210 may include a support portion 211 and a crown portion 212. The support portion 211 is located between the substrate 100 and the crown portion 212, and an orthographic projection of the support portion 211 on the substrate 100 is within an orthographic projection of the crown portion 212 on the substrate 100. Thus, the isolation structure 210 is configured to be in a shape with a wide upper part and a narrow lower part, so that the isolation structure 210 may isolate the light-emitting function layers 223 (including the first common layer 2231, where the first common layer 2231 is the main film layer causing current crosstalk) of adjacent light-emitting devices, thereby reducing a problem of current crosstalk between the adjacent light-emitting devices 220.

In some designs of the present disclosure, the support portion 211 and the crown portion 212 may be of a multi-layer stacked structure as shown in FIG. 3, so that the support portion 211 and the crown portion 212 are made of different materials, respectively. For example, the support portion 211 in the following embodiment is designed to be conductive, but the crown portion 212 is not limited to being conductive. Alternatively, in some other designs of the present disclosure, the support portion 211 and the crown portion 212 may be configured as an integrated structure to increase firmness of the isolation structure 210.

In at least one embodiment of the present disclosure, as shown in FIG. 3, the support portion 211 may be a conductive structure, and the second electrode 222 is located in the first opening 201 and is connected to the support portion 211. Thus, the second electrodes 222 are connected in series by the support portion 211 of the isolation structure 210, so that a common electrode is formed by the support portion 211 and the second electrode 222 for ease of driving.

A material of the second electrode 222 may be a metal material. The less a thickness of the second electrode 222 is, the higher the light transmittance of the second electrode 222 is, but the higher the resistivity of the second electrode 222 is. If the thickness of the second electrode 222 is too small, a voltage drop of the second electrode 222 (as the common electrode at this time) may be too large under a condition that the isolation structure is not provided. In the embodiment of the present disclosure, the second electrode 222 is connected to the conductive support portion 211, so that a thickness limitation of the second electrode 222 may be released. Therefore, the second electrode 222 may has a less thickness to have a higher light transmittance.

In at least one embodiment of the present disclosure, the support portion 211 may be of a metal conductive structure. As a conductivity of a metal material is high, a voltage drop when the second electrode is driven may be reduced. Correspondingly, the metal material may only transmit light when a thickness of the metal material is extremely thin (such as in tens of nanometers). However, a certain thickness of the isolation structure 220 is required to isolate the light-emitting function layer 223 (including the first common layer 2231). Therefore, the support portion 211 in the isolation structure 220 is almost opaque. Thus, the isolation structure 220 may be light-transmitting only by the second openings 202.

In some embodiments of the present disclosure, as shown in FIG. 3, the display panel may further include a pixel defining layer 213. The pixel defining layer 213 is located between the isolation structure 210 and the substrate 100 and located between the isolation structure 210 and the first electrode 221. The pixel defining layer 213 is configured to define a plurality of third openings 203 respectively corresponding to the plurality of first openings 201, so as to expose the first electrode 221. An orthographic projection of the third opening 203 on the substrate 100 is within an orthographic projection of the first opening 201 corresponding to the third opening 203 on the substrate 100, so that the first electrode 221 may have a large design area without contacting the support portion 211, thereby enlarging effective light-emitting area of the light-emitting device 220.

In the embodiment of the present disclosure, a specific structure of the touch electrode layer is not limited and may be designed based on a requirement of an actual process. Different designs of the touch electrode layer are described below through different embodiments, specifically as follows.

In at least one embodiment of the present disclosure, as shown in FIGS. 3 to 7, the touch electrode 400 further includes a plurality of parallel first touch electrodes 410 and a plurality of parallel second touch electrodes 420. The first touch electrodes 410 and the second touch electrodes 420 intersect with each other and a touch unit P is formed at intersection. Each touch unit P corresponds to a touch position coordinate. The first touch electrodes 410 and the second touch electrodes 420 are both spaced apart from the dummy electrode 401. The first touch electrode 410 includes a plurality of first connecting portions 412 and a plurality of first touch electrode blocks 411 spaced apart from each other by the second touch electrodes 420. The first touch electrode blocks 411 of a same first touch electrode 410 are connected to each other through the first connecting portion 412. The second touch electrode 420 includes a plurality of second connecting portions 422 and a plurality of second touch electrode blocks 421 spaced apart from each other by the first touch electrodes 410. The second touch electrode blocks 421 of a same second touch electrode 420 are connected to each other through the second connecting portion 422. The first touch electrode block 410, the second touch electrode block 421, and the dummy electrode 401 are disposed in a same layer and made of a same material, that is, the first touch electrode 410, the second touch electrode block 421 and the dummy electrode 401 may be formed by a continuous material film layer. The second connecting portion 422 and the first connecting portion 412 intersect with each other and are spaced apart from each other. An intersection point of the first connecting portion 412 and the second connecting portion 422 is an intersection point of the first touch electrode 410 and the second touch electrode 420. The second connecting portion 422 may be located between a layer where the first touch electrode 410 is located and the isolation structure, or the second connecting portion 422 may be located on a side, facing away from the isolation structure, of the layer where the first touch electrode 410 is located. For example, in an implementable process flow, a first conductive material layer may be first deposited and patterned to form the plurality of first touch electrodes 410 and the second touch electrode blocks 421 of the plurality of second touch electrodes 420. And a plurality of mesh openings are formed in the first conductive material layer, so that the first touch electrodes 410 and the second touch electrode blocks 421 of the plurality of second touch electrodes 420 are formed as grid electrodes. An insulating layer 430 is deposited to cover the first touch electrodes 410 and the second touch electrode blocks 421 of the plurality of second touch electrodes 420. The insulating layer 430 is patterned to form through holes exposing the plurality of second touch electrode blocks 421. And a second conductive material layer is deposited on the insulating layer 430, and is patterned to form the second connecting portions 422 of the second touch electrodes 420. The second connecting portions 422 are connected to the second touch electrode blocks 421 through the through holes. In this design, the first touch electrode 410 and main body parts of the second touch electrode 420 are designed in the same layer, so that an alignment problem of mesh openings of the first touch electrode 410 and the second touch electrode 420 does not need to be considered, which is beneficial to improving light transmittance of the touch electrode layer 400.

In the embodiment of the present disclosure, a size relationship between the dummy electrode 401 and the first area 13 is not limited. As long as the dummy electrode exists in the first area 13, the problem of signal interference between touch and display may be alleviated through the dummy electrode 401.

Figure 8:
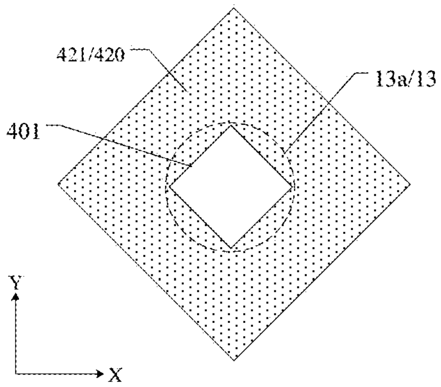
FIG. 8 is a plane schematic structural diagram of a positional relationship between a touch electrode block and a first area in a display panel according to an embodiment of the present disclosure.

If an area of the dummy electrode 401 is too large, an area where the touch function is implemented in the touch electrode will become smaller, causing touch performance to be affected. In order to ensure the touch performance, as shown in FIG. 8, an area of the first area 13*a* is greater than an area of the dummy electrode 401, and an orthographic projection of the dummy electrode 401 on the substrate is located within an orthographic projection of the first area 13*a* on the substrate.

Figure 9:
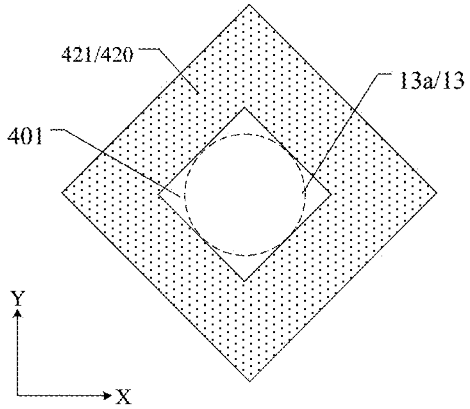
FIG. 9 is a plane schematic structural diagram of a positional relationship between a touch electrode block and a first area in a display panel according to another embodiment of the present disclosure.

For example, as shown in FIG. 9, an area of the dummy electrode 401 is greater than an area of the first area 13*a*, and an orthographic projection of the first area 13*a* on the substrate is located within an orthographic projection of the dummy electrode 401 on the substrate, so that the signal interference problem between touch and display may be further alleviated. In the embodiment of the present disclosure, a position and a specific shape of the dummy electrode in the touch electrode are not limited, and may be designed based on a specific design requirement of the touch electrode, distribution of the first area 13, and the like. In the following, several manners of arrangement of the dummy electrode will be described through several specific embodiments.

In some embodiments of the present disclosure, as shown in FIGS. 4 to 9, at least one dummy electrode 401 is located in the first touch electrode block 411 and/or the second touch electrode block 421. Thus, an arrangement of the dummy electrode 401 may reduce design areas of the first touch electrode block 411 and the second touch electrode block 421, thereby increasing sensitivity of a touch function of the touch structure and reducing a load when the touch electrode is driven. It should be understood that by providing the dummy electrode 401, design areas of the first touch electrode block 411 and the second touch electrode block 421 may be reduced, thereby reducing a capacitance formed at the touch unit. Therefore, when a touch operation (such as a finger approaching) is performed, a capacitance variation (proportion) caused by the touch operation is further greater, so that a touch is easier to recognize, that is, a touch sensitivity is increased.

For example, in some designs, as shown in FIGS. 4 to 9, inner sides of all the first touch electrode blocks 411 and all the second touch electrode blocks 421 are provided with the dummy electrodes 401.

For example, in some other designs, an inner side of at least one of the first touch electrode blocks 411 and/or the second touch electrode blocks 421 is provided with the dummy electrode 401 corresponding to the first area 13, and the first touch electrode block 411 and/or the second touch electrode block 421 not corresponding to the first area 13 is not provided with the dummy electrode 401. That is, a position of the dummy electrode is determined based on a position of the first area 13, and it may be understood as providing the dummy electrode based on a configuration requirement of the first area 13.

In some other embodiments, at least one dummy electrode 401 is located between the first touch electrode block 411 and the second touch electrode block 421. Thus, the dummy electrode 401 may space the first touch electrode block 411 apart from the second touch electrode block 421, so as to reduce a risk that the first touch electrode block 411 and the second touch electrode block 421 are connected. In addition, at least a part of the dummy electrode 401 may be used to prepare a signal line connected to the first touch electrode 410 or the second touch electrode 420, so that a signal line of the touch structure is arranged in the display area, thereby reducing a frame of the display panel.

Figure 10:
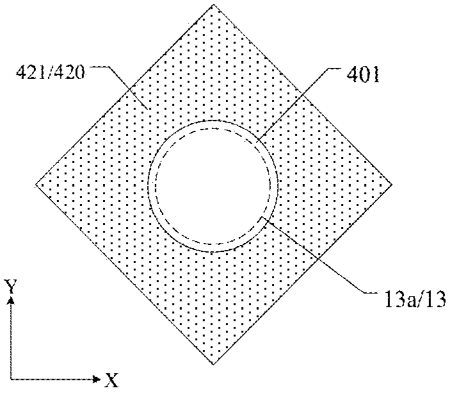
FIG. 10 is a plane schematic structural diagram of a positional relationship between a touch electrode block and a first area in another display panel according to still another embodiment of the present disclosure.
Figure 11:
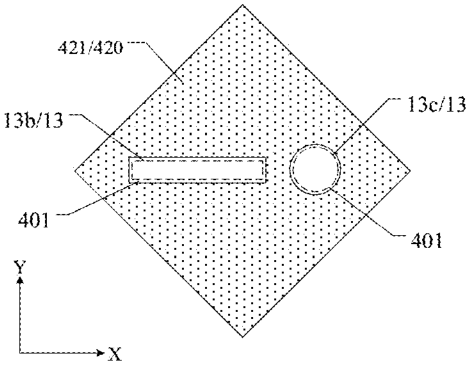
FIG. 11 is a plane schematic structural diagram of a positional relationship between a touch electrode block and a first area in another display panel according to yet still another embodiment of the present disclosure.

In at least one embodiment of the present disclosure, a planar shape of the dummy electrode may be designed based on a planar shape of the first area 13, that is, a shape of an edge of the first touch electrode block 411 and/or the second touch electrode block 421 adjacent to the dummy electrode 401 is the same as a shape of an edge of the dummy electrode 401. As shown in FIG. 10 and FIG. 11, shapes of the edge of the dummy electrode 401 and the edge of the first area 13 are both circular.

Figure 12:
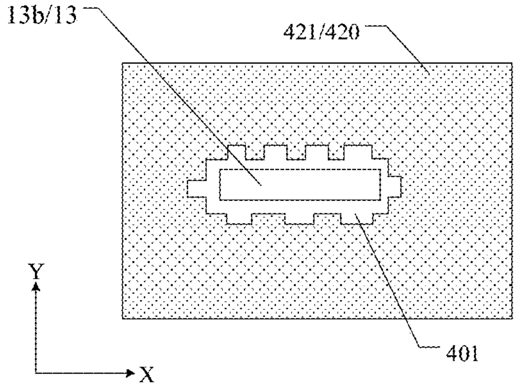
FIG. 12 is an enlarged schematic structural diagram with respect to the first area 13*b* and the touch electrode around the first area 13*b* shown in FIG. 11 according to a design.
Figure 13:
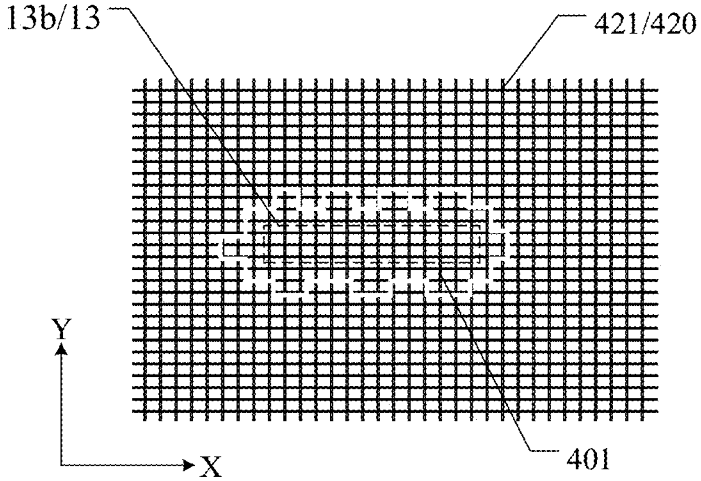
FIG. 13 is an enlarged schematic structural diagram with respect to the first area 13*b* and the touch electrode around the first area 13*b* shown in FIG. 11 according to another design.

For example, in at least one embodiment of the present disclosure, as shown in FIG. 12 and FIG. 13, the shape of the edge of the dummy electrode 401 is curved. In this design, the curved edge may alleviate phenomena of optical diffraction, interference, and the like at the edge of the dummy electrode 401, so as to reduce optical visibility phenomenon (where a shape rule leads to an optical phenomenon to be visually visible) at the edge of the dummy electrode 401.

In the embodiment of the present disclosure, a “curved” shape may include shapes of wavy, serrated, and the like.

In the embodiment of the present disclosure, two designs that the edge of the dummy electrode and the edge of the first area 13 are conformal and the edge of the dummy electrode is designed in a curved shape coexist. Term “conformal” refers to similar shapes at a macroscopic level, while “curved” shape refers to a design at a microscopic level. For example, FIG. 12 is an enlarged view of an area 13*b* and a structure around the area 13*b* shown in FIG. 11. In FIG. 11, an overall shape of the first area 13 (area 13*b*) and the dummy electrode 401 are both rectangular at the macroscopic level and their shapes are roughly similar. In FIG. 12, an edge shape of the dummy electrode 401 is curved (serrated) at the microscopic level.

In the embodiment of the present disclosure, to ensure the light transmittance, the touch electrode may be designed to be made of a transparent conductive material or as a grid structure, so as to avoid blocking light emitted by the light-emitting device.

For example, in some embodiments of the present disclosure, referring back to FIG. 3, a material of the touch electrode 400 includes a transparent conductive material. This design may simplify a preparation process of the touch electrode 400, and the touch electrode 400 does not block light emission of the light-emitting device 220, so as to ensure a viewing angle of the display panel. For example, the transparent conductive material may be materials such as indium tin oxide (ITO).

Figure 14:
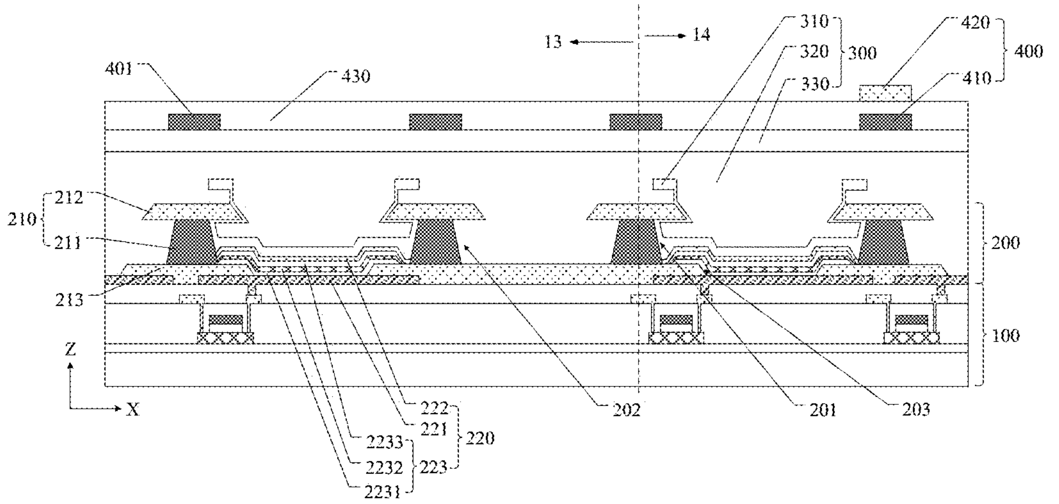
FIG. 14 is a cross-sectional view of the display panel along M1-N1 shown in FIG. 2 according to another design with the touch electrode being configured as a grid electrode.

For example, in other embodiments of the present disclosure, as shown in FIG. 13 and FIG. 14, the touch electrode 400 is a grid electrode, and the touch electrode includes a plurality of touch electrode lines and a plurality of touch electrode mesh openings. The touch electrode mesh openings of the grid electrode correspond to the first opening 201 and the second opening 202 respectively. An orthographic projection of the touch electrode mesh openings on the substrate 100 coincide with orthographic projections of a corresponding first opening 201 and a corresponding second opening 202 on the substrate, or covers the orthographic projections of the corresponding first opening and the corresponding second opening on the substrate, or is located within the orthographic projections of the corresponding first opening 201 and the corresponding second opening 202 on the substrate 100. Optionally, a material of the touch electrode 400 includes a metal. Light emission of the light-emitting device 220 is not blocked by the grid electrode, and the design may release a limitation on a material for preparing the touch electrode 400, so that the material of the touch electrode 400 may include a material with a high conductivity such as metal, thereby reducing the load when the touch electrode 400 is driven.

In at least one embodiment of the present disclosure, as shown in FIG. 14, the display panel may further include a first encapsulation layer 310. The first encapsulation layer 310 is located on a side, facing away from the substrate 100, of the display function layer 200 and includes a plurality of encapsulation units respectively corresponding to the first openings 201. And at least a part of the encapsulation unit fills a corresponding first opening 201. A film layer of the light-emitting device 220 is protected by the first encapsulation layer 310 during a preparation process of the display panel. Light-emitting devices 220 emitting light of different colors are independently manufactured, but the film layer (such as the light-emitting function layer 223) of each light-emitting device 220 is a whole surface deposited on the display panel during evaporation. For example, the light-emitting devices 220 are classified as a light-emitting device emitting red light (R), a light-emitting device emitting green light (G), and a light-emitting device emitting blue light (B) respectively. During a preparation process, the light-emitting devices R, G, and B are sequentially prepared. When the light-emitting device R is prepared, the light-emitting device R is formed in each first opening, the first encapsulation layer 310 is prepared on the display panel to cover the light-emitting device R. and then the first encapsulation layer 310 as well as a cathode and a light-emitting function layer 223 of the light-emitting device R in some first openings (used to form light-emitting devices G and B in a final product) are removed. During the process, the first encapsulation layer 310 is used to protect the light-emitting devices R in other first openings. According to the method, the light-emitting devices G and B are sequentially prepared, and the first encapsulation layer 310 as shown in FIG. 3 is ultimately formed. In the above preparation process, the first encapsulation layer 310 in the second opening 202 may be removed, so as to further increase the light transmittance of the first area 13.

Light-emitting devices in the display panel may be configured to emit light of the same color (such as blue light, white light), and a light conversion layer (such as quantum dot or other materials that may change a color of light), a color filter, and the like may be disposed on a light emission side of the display panel, so as to enable the display panel to display color images. In this case, the first encapsulation layer 310 may alternatively be configured as a continuous whole layer structure, and is not limited to the plurality of encapsulation units as shown in FIG. 14.

In a specific embodiment of the present disclosure, the display panel further includes a second encapsulation layer 320 and a third encapsulation layer 330 covering the first encapsulation layer 310. The second encapsulation layer 320 is located between the first encapsulation layer 310 and the third encapsulation layer 330, and the touch structure is located on a side, facing away from the substrate 100, of the third encapsulation layer 330. The first encapsulation layer 310 and the third encapsulation layer 330 are inorganic film layers, and the inorganic film layer has a high density to block water and oxygen. The second encapsulation layer 320 is an organic film layer, and a surface, facing away from the substrate 100, of the second encapsulation layer 320 is flat.

In at least one embodiment of the present disclosure, as shown in FIG. 14, the substrate 100 may include a base and a driving circuit layer located on the base. The driving circuit layer includes a plurality of pixel driving circuits located in the display area, and the display function layer is located on the driving circuit layer. For example, the pixel driver circuit may include a plurality of transistor thin film transistors (TFT), capacitors, and the like, arranged in various forms such as 2T1C (that is two transistor thin film transistors (TFT) and one capacitor (C)), 3T1C, or 7T1C. The pixel driver circuit is connected to the light-emitting device 200 to control an on/off state and brightness of the light-emitting device 220.

Figure 16:
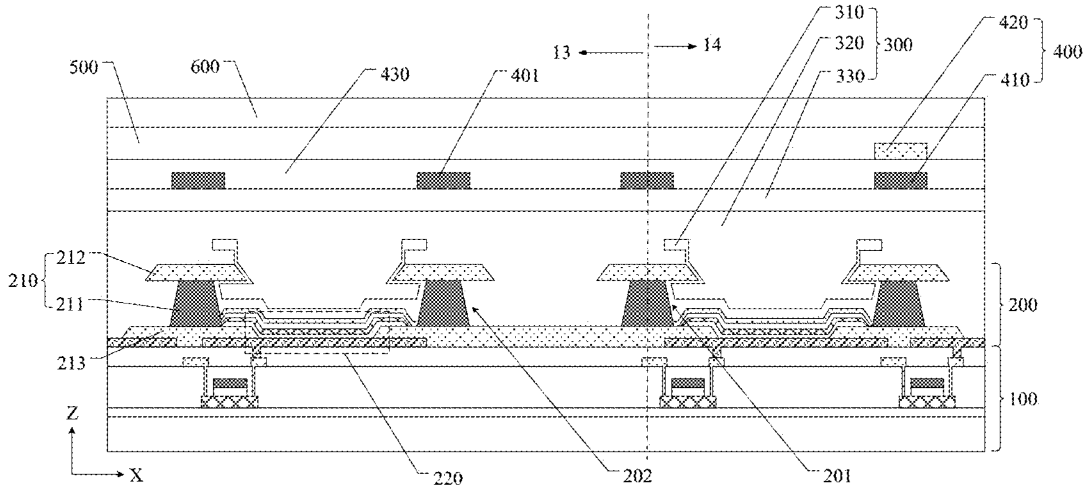
FIG. 16 is a cross-sectional view of a partial area of a display panel according to an embodiment of the present disclosure.

For example, as shown in FIG. 16, the display panel may further include structures such as an optical film 500, and a cover plate 600.

In the embodiment of the present disclosure, arrangement of pixels in the display panel and a specific arrangement of the second opening in the first area are not limited, and may be designed based on requirements of an actual process.

For example, in some embodiments of the present disclosure, referring back to FIG. 2, sub-pixels may be arranged in a matrix manner into a plurality of rows and a plurality of columns, and the second openings 202 for light transmission may be disposed between adjacent rows and adjacent columns.

Figure 15:
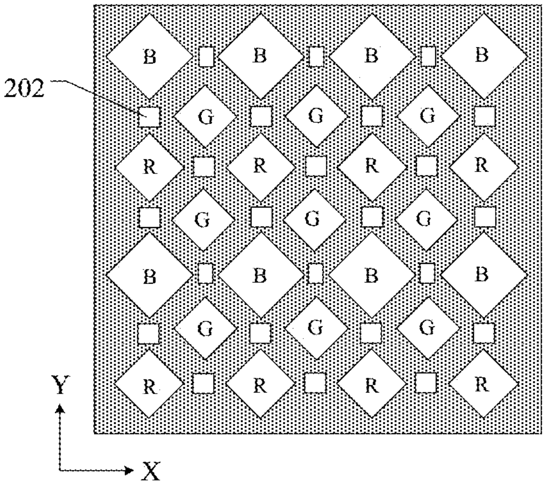
FIG. 15 is an enlarged view of an area S1 of the display panel shown in FIG. 1 according to another design.

For example, in other embodiments of the present disclosure, as shown in FIG. 15, sub-pixels may be arranged in a plurality of rows and a plurality of columns. Sub-pixels of adjacent rows are arranged in a staggered manner, and sub-pixels of adjacent columns are arranged in a staggered manner. The second opening 202 for light transmission is disposed at a gap between every four adjacent sub-pixels.

In the embodiment of the present disclosure, distribution of the first area provided in the display area is not limited, and may be designed based on an application scenario of the display panel.

For example, in some embodiments of the present disclosure, a plurality of first areas are provided and spaced apart from each other, and are uniformly arranged in the display area. In the design, the display panel may be applied to the field of transparent display. For example, in the design, the dummy electrodes may be uniformly arranged in the display area.

For example, in other embodiments of the present disclosure, referring back to FIG. 1, the display area 11 may further include a second area 14. Light transmittance of the second area 14 is less than light transmittance of the first area 13, and the isolation structure and touch structure are further located in the second area 14. Optionally, in a case where the display area includes the second area 14, all second openings 202 are located in the first area 13, and the second area 14 is not provided with the second opening 202. In this design, the display panel may be applied to scenes such as under-screen camera shooting, fingerprint recognition and infrared ranging. The first area 13 may be correspondingly designed as a camera area, a fingerprint recognition area, an infrared detection area, and the like, and a corresponding position of the first area 13 may be provided with a recognition device such as a camera, a fingerprint recognition device, an infrared ranging devices. Optionally, in a case where the display area includes the second area 14, a size of the dummy electrode located in the second area 14 is different from a size of the dummy electrode located in the first area 13, so that the size of the dummy electrode in the second area 14 is not limited by the dummy electrode in the first area 13. The sizes of the dummy electrodes in the second area 14 may be the same, and the size of the dummy electrode in the first area 13 may be related to a size of a recognition device at a corresponding position of the first area 13. For example, the size of the dummy electrode in the first area 13 is the same or close to the size of the recognition device at the corresponding position of the first area 13. A shape of the dummy electrode in the first area 13 may be the same as a shape of the recognition device corresponding to the first area 13.

Optionally, in a case where the display area includes the second area 14, an area of an orthographic projection of the dummy electrode in the second area 14 on the substrate is less than an area of an orthographic projection of the dummy electrode on the substrate in the first area 13. Thus, a design area of a part of the touch electrode used to achieve a touch function is ensured, so as to ensure an accuracy of touch detection (such as avoiding overly sensitive touch).

Optionally, in a case where the display area includes the second area 14, a shape of the dummy electrode located in the second area 14 is different from a shape of the dummy electrode located in the first area 13, so that the shape of the dummy electrode in the second area 14 is not limited by the dummy electrode in the first area 13.

In the following, a process for manufacturing the display panel shown in FIG. 14 is described with reference to with FIGS. 17 to 22 to visually demonstrate a principle that the isolation structure may increase pixels per inch (PPI).

Figure 17:
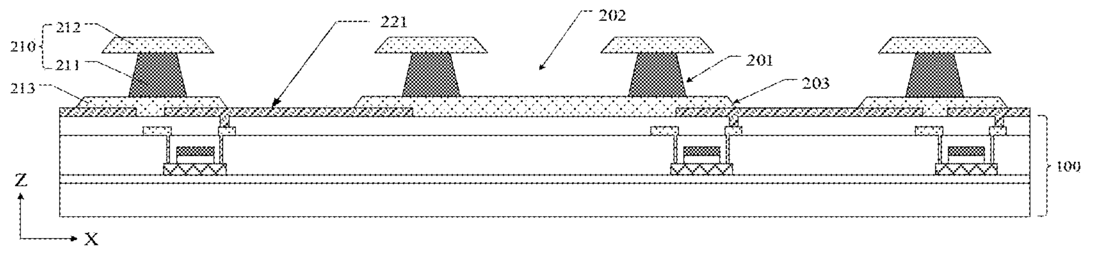
FIGS. 17 to 22 are schematic diagrams of a manufacturing method for a display panel according to an embodiment of the present disclosure.

As shown in FIG. 17, a substrate 100 is provided, and a plurality of first electrodes 221 arranged in an array are formed on the substrate 100. An insulating material film layer (such as an inorganic material film layer) is deposited on the substrate 100 after the plurality of first electrodes 221 are formed. A plurality of support portions 211 and a plurality of crown portions 212 are formed on the display panel. A plurality of first openings 201 and a plurality of second openings 202 are formed therein. A patterning process is performed to the insulation material film layer to form a pixel defining layer 213 (with a grid-like planar shape). The pixel defining layer 213 includes a plurality of third openings 203 and covers a gap between adjacent first electrodes 221. Therefore, a planar shape of the pixel defining layer 213 is grid-like.

In the embodiment of the present disclosure, the patterning process may be a photolithography patterning process, and for example, may includes: coating photoresist on a structural layer to be patterned, exposing the photoresist by using a mask plate, developing exposed photoresist to obtain a photoresist pattern, etching the structural layer with the photoresist pattern (optionally wet etching or dry etching), and then optionally removing the photoresist pattern. In a case where a material of the structural layer (such as a photoresist pattern 700 mentioned below) includes photoresist, the structural layer may be directly exposed through a mask plate to form a desired pattern.

Figure 18:
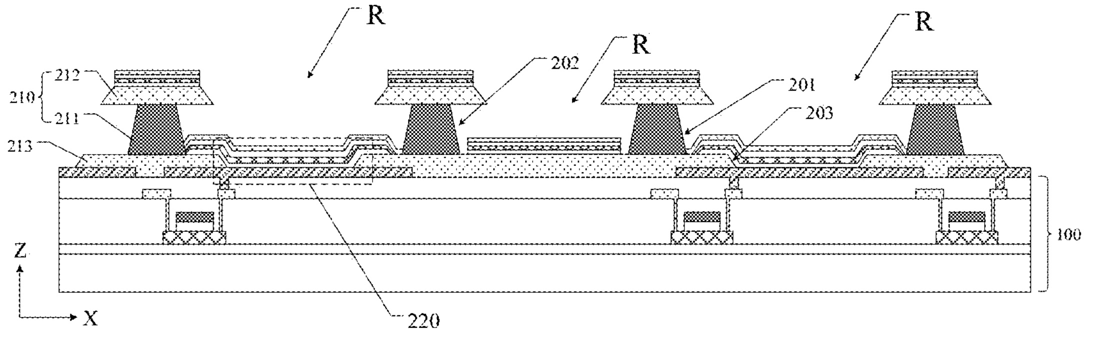

As shown in FIG. 18, a light-emitting function layer and a second electrode are evaporated on the substrate 100 to form a light-emitting device 220 in each first opening 201 of the isolation structure 210. A fine metal mask plate is not used during evaporation, so that an evaporated material is further deposited on the crown 212 and in the second opening 202. For example, a light-emitting function layer of the evaporated light-emitting device 220 may emit red light (R), that is, at this stage, a light-emitting device 220 emitting blue light is formed in each first opening 201 and second opening 202 of the isolation structure 210.

Figure 19:
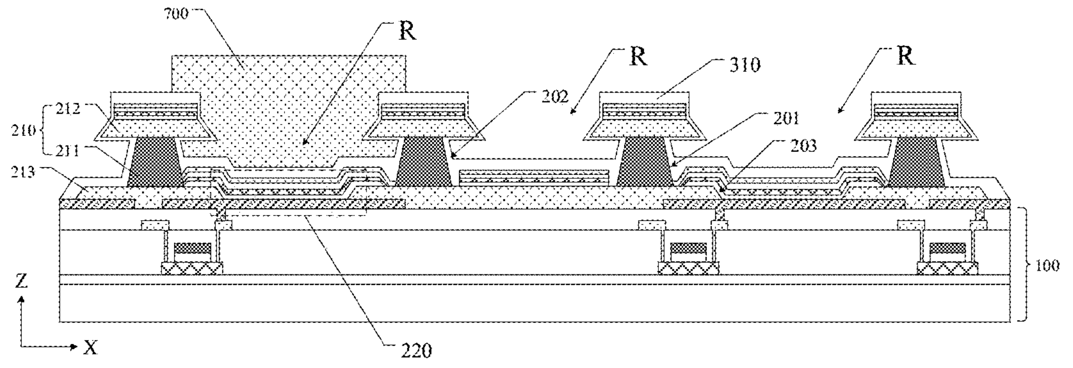

As shown in FIG. 19, a first encapsulation layer 310 is deposited to cover the light-emitting device 200, and the first encapsulation layer 310 covers the entire display area at this stage. Photoresist is formed (such as coating) on the first encapsulation layer 310, and then a patterning process is performed to form a photoresist pattern 700. The photoresist pattern 700 only covers part of first openings 201 (first openings 201 where light-emitting devices B of a finished display panel is located) of the isolation structure 210.

Figure 20:
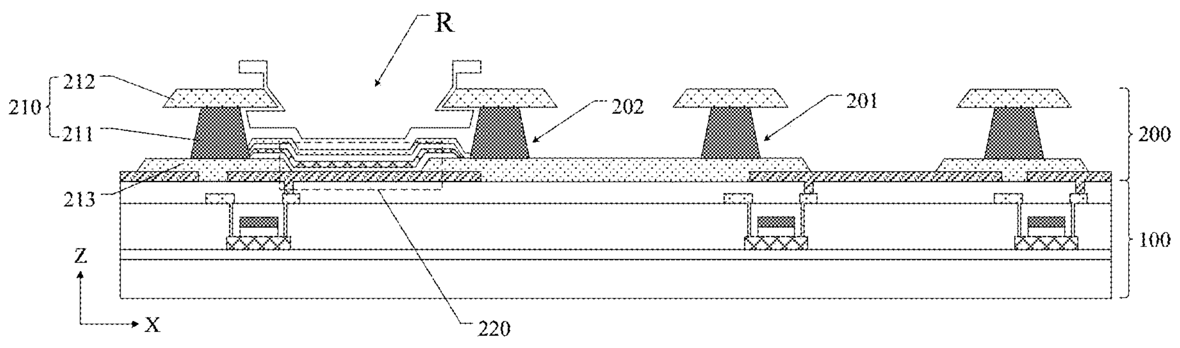

As shown in FIG. 20, a surface of the display panel is etched by using the photoresist pattern 700 as a mask, and the first encapsulation layer 310, a second electrode, and a light-emitting function layer not covered by the photoresist pattern 700 are removed. Then a remaining photoresist pattern 700 is removed.

Figure 21:
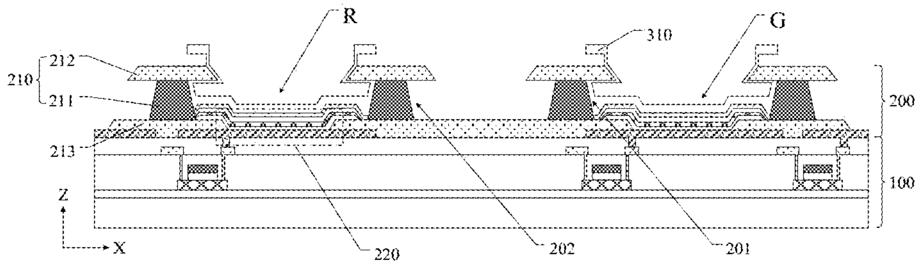

As shown in FIG. 21, the above steps shown in FIG. 17 to FIG. 20 are repeated, so as to form light-emitting devices 220 emitting green light and blue light respectively in other first openings 201.

Figure 22:
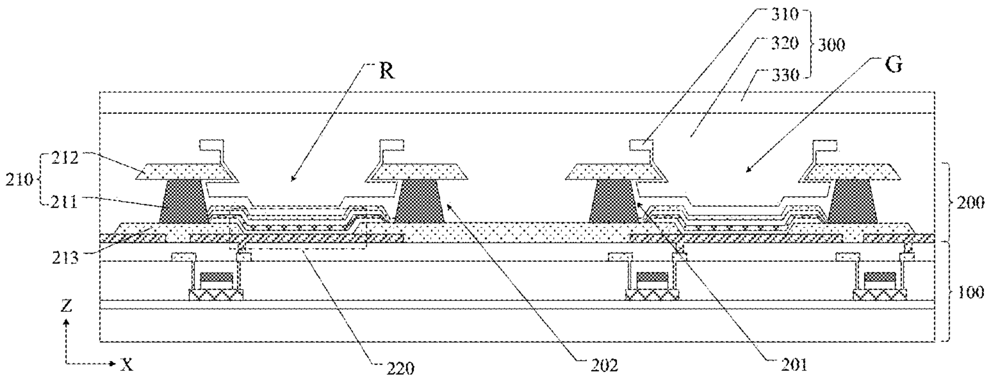

As shown in FIG. 22, a second encapsulation layer 320 and a third encapsulation layer 330 are formed on the first encapsulation layer 310, respectively.

Referring back to FIG. 14, the touch electrode 400 is prepared on the third encapsulation layer 330, and a preparation process may be referred to relevant description in the embodiment mentioned above, and will not be repeated here.

In some embodiments of the present disclosure, some film layers in the light-emitting function layer, such as a light-emitting layer, may be prepared by using a non-vapor deposition method such as inkjet printing. Specifically, the method used may be chosen based on a material of the film layers. For example, in a case where a material of the film layers is a polymer material and is not suitable for vapor deposition, inkjet printing may be used for preparation.

At least one embodiment of the present disclosure provides a display device, and the display device may include the display panel in the embodiment mentioned above. Furthermore, in a case where the first area is a recognition area, the display device may include a recognition device, and an orthographic projection of the recognition device on the substrate overlaps at least partially with the first area.

For example, in some embodiments of the present disclosure, referring back to FIG. 1 and FIG. 23, the display area 11 further includes a second area 14, and a light transmittance of the second area 14 is less than a light transmittance of the first area 13. The display device further includes at least one recognition device 20 corresponding to the first area 13. The recognition device 20 is located on a side, facing away from the isolation structure, of the substrate 100 of the display panel, and an orthographic projection of the first area 13 on the substrate 100 coincides with an orthographic projection of the recognition device 20 on the substrate 100. Alternatively, the orthographic projection of the recognition device 20 on the substrate 100 is within the orthographic projection of the first area 13 on the substrate 100.

Figure 23:
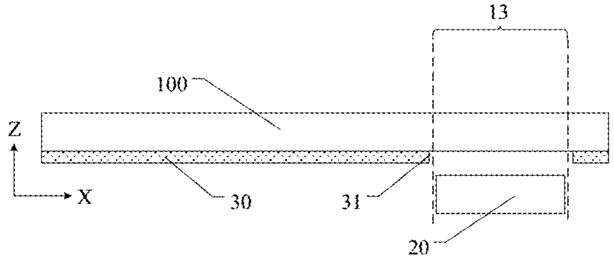
FIG. 23 is a cross-sectional view of a display device according to an embodiment of the present disclosure.
Figure 24:
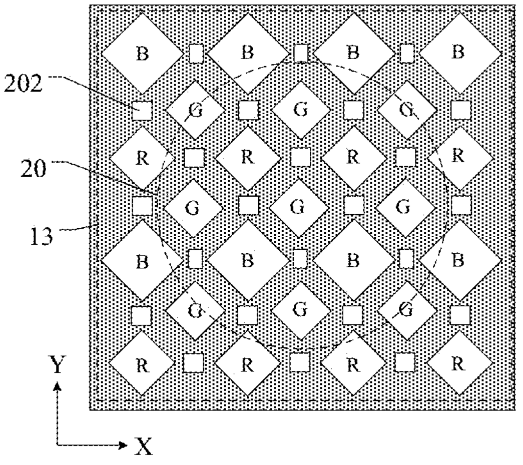
FIG. 24 is a schematic structural diagram of a positional relationship between a first area and a recognition device in a display panel according to an embodiment of the present disclosure.

For example, in some embodiments of the present disclosure, as shown in FIG. 23, the recognition device 20 includes at least one fingerprint recognition sensor. For example, the fingerprint recognition sensor may be disposed on a side, facing away from the display function layer, of the substrate, or the fingerprint recognition sensor may alternatively be disposed within the substrate. As shown in FIG. 24, a plurality of second openings 202 are provided in the first area 13, and an orthographic projection of the recognition device 20 on the substrate 100 is located within an orthographic projection of the first area 13 on the substrate 100.

For example, in other embodiments of the present disclosure, the recognition device 20 may be a function device such as a camera, and an infrared ranging device, and the function device may be located on a side, facing away from the display function layer, of the substrate.

In at least one embodiment of the present disclosure, as shown in FIG. 23, the display device further includes a foam layer 30. The foam layer 30 is located on a side, facing away from the display function layer, of the substrate in the display panel. The foam layer 30 includes a light-transmitting opening 31, and an orthographic projection of the recognition device 20 on the substrate is located within an orthographic projection of the light-transmitting opening 31 on the substrate.

For example, in the embodiment of the present disclosure, the display device may be any product or component with a display function, such as a television, a digital camera, a mobile phone, a watch, a tablet computer, a laptop computer, and a navigation device.

The above descriptions are only preferred embodiments of the present specification, and are not intended to limit the present specification. Any modifications, equivalent replacements, and the like made within the spirit and principles of the present specification should be included within the scope of protection of the present specification.

What is claimed is:

1. A display panel, comprising a display area, wherein the display area comprises at least one first area, and the display panel comprises:

a substrate;

a display function layer, located on the substrate and comprising a plurality of light-emitting devices;

an isolation structure, located on the substrate and located in the display area, wherein the isolation structure comprises a plurality of first openings and a plurality of second openings, the plurality of second openings are located in the first area, and the first opening is configured to define the light-emitting device; and a touch structure, located on a side, facing away from the substrate, of the isolation structure and comprising a touch electrode, wherein the touch electrode comprises a dummy electrode, and an orthographic projection of at least one of the second openings on the substrate is located within an orthographic projection of the dummy electrode on the substrate.

2. A display device, comprising the display panel according to claim 1.

3. The display device according to claim 2, further comprising at least one recognition device corresponding to the first area, wherein an orthographic projection of the first area on the substrate coincides with an orthographic projection of the recognition device on the substrate, or the orthographic projection of the recognition device on the substrate is located within the orthographic projection of the first area on the substrate.

4. The display device according to claim 3, wherein a shape of the dummy electrode of the first area is the same as a shape of the recognition device corresponding to the first area.

5. The display device according to claim 3, further comprising a foam layer, wherein the foam layer is located on a side, facing away from the display function layer, of the substrate in the display panel, the foam layer comprises a light-transmitting opening, and the orthographic projection of the recognition device on the substrate is located within an orthographic projection of the light-transmitting opening on the substrate.

6. The display panel according to claim 1, wherein the touch electrode further comprises a plurality of parallel first touch electrodes and a plurality of parallel second touch electrodes, the first touch electrode and the second touch electrode intersect with each other and are spaced apart from the dummy electrode, the first touch electrode comprises a plurality of first connecting portions and a plurality of first touch electrode blocks, the plurality of first touch electrode blocks are spaced apart from each other by the second touch electrode, first touch electrode blocks of a same first touch electrode are connected to each other through the first connecting portion, the second touch electrode comprises a plurality of second connecting portions and a plurality of second touch electrode blocks, the plurality of second touch electrode blocks are spaced apart from each other by the first touch electrode, and second touch electrode blocks of a same second touch electrode are connected to each other through the second connecting portion, and the first touch electrode block, the second touch electrode block, and the dummy electrode are disposed in a same layer and made of a same material, and the second connecting portion and the first connecting portion intersect with each other and are spaced apart from each other.

7. The display panel according to claim 6, wherein at least one of the dummy electrode is located in the first touch electrode block or the second touch electrode block.

8. The display panel according to claim 7, wherein inner sides of all the first touch electrode blocks and all the second touch electrode blocks are provided with the dummy electrodes, or an inner side of at least one of the first touch electrode blocks and the second touch electrode blocks is provided with the dummy electrode corresponding to the first area, and the first touch electrode block and the second touch electrode block not corresponding to the first area is not provided with the dummy electrode; or at least one dummy electrode is located between the first touch electrode block and the second touch electrode block.

9. The display panel according to claim 6, wherein a shape of an edge of the first touch electrode block or the second touch electrode block adjacent to the dummy electrode is the same as a shape of an edge of the dummy electrode; and the shape of the edge of the dummy electrode is curved.

10. The display panel according to claim 1, wherein the light-emitting device comprises a first electrode, a light-emitting function layer, and a second electrode sequentially stacked on the substrate, and the light-emitting function layer is located in the first opening; and the isolation structure comprises a support portion and a crown portion, the support portion is located between the crown portion and the substrate, the support portion and the crown portion are configured to surround the first opening and the second opening, and an orthographic projection of the support portion on the substrate is located within an orthographic projection of the crown portion on the substrate.

11. The display panel according to claim 10, wherein the support portion is of a conductive structure, and the second electrode is located in the first opening and is connected to the support portion.

12. The display panel according to claim 11, further comprising a pixel defining layer, wherein the pixel defining layer is located between the support portion and the substrate and a plurality of third openings respectively corresponding to the first openings are formed in the pixel defining layer, an orthographic projection of the third opening on the substrate is located within an orthographic projection of the first opening corresponding to the third opening on the substrate to expose the first electrode, and an edge portion of the first electrode is located between the pixel defining layer and the substrate.

13. The display panel according to claim 1, wherein an orthographic projection of the first area on the substrate overlaps with the orthographic projection of the dummy electrode on the substrate, and the orthographic projection of the dummy electrode on the substrate is located within the orthographic projection of the first area on the substrate.

14. The display panel according to claim 1, wherein an orthographic projection of the first area on the substrate overlaps with the orthographic projection of the dummy electrode on the substrate, and the orthographic projection of the first area on the substrate is located within the orthographic projection of the dummy electrode on the substrate.

15. The display panel according to claim 1 wherein a material of the touch electrode comprises a transparent conductive material; or the touch electrode is a grid electrode, the touch electrode comprises a plurality of touch electrode lines and a plurality of touch electrode mesh openings, the touch electrode mesh openings of the grid electrode correspond to the first opening and the second opening respectively, an orthographic projection of the touch electrode mesh openings on the substrate coincides with orthographic projections of a corresponding first opening and a corresponding second opening on the substrate, or covers the orthographic projections of the corresponding first opening and the corresponding second opening on the substrate, and a material of the touch electrode comprises a metal; or the orthographic projection of the at least one of the second openings on the substrate is located within an orthographic projection of an outer boundary of the dummy electrode on the substrate.

16. The display panel according to claim 1, further comprising:

a first encapsulation layer, located on a side, facing away from the substrate, of the display function layer and comprising a plurality of encapsulation units respectively corresponding to the plurality of first openings, wherein at least a part of the encapsulation unit fills a corresponding first opening; and a second encapsulation layer and a third encapsulation layer covering the first encapsulation layer, wherein the second encapsulation is located between the first encapsulation layer and the third encapsulation layer, and the touch structure is located on a side, facing away from the substrate, of the third encapsulation layer, and the first encapsulation layer and the third encapsulation layer are inorganic film layers, the second encapsulation layer is an organic film layer, and a surface, facing away from the substrate, of the second encapsulation layer is flat.

17. The display panel according to claim 1, wherein a plurality of first areas are provided and spaced apart from each other, and are uniformly arranged in the display area; or the display area further comprises a second area, a light transmittance of the second area is less than a light transmittance of the first area, and the isolation structure and the touch structure are further located in the second area;

a size of the dummy electrode located in the second area is different from a size of the dummy electrode located in the first area;

an orthographic projection area of the dummy electrode in the second area on the substrate is less than an orthographic projection area of the dummy electrode on the substrate in the first area;

a shape of the dummy electrode located in the second area is different from a shape of the dummy electrode located in the first area.

18. The display panel according to claim 1, wherein the display area further comprises a second area, a light transmittance of the second area is less than a light transmittance of the first area, and the isolation structure and the touch structure are further located in the second area; and the second openings are located in the first area.

19. A display panel, comprising a display area, wherein the display area comprises at least one first area, and the display panel comprises:

a substrate;

a display function layer, located on the substrate and comprising a plurality of light-emitting devices;

an isolation structure, located on the substrate and located in the display area, wherein the isolation structure comprises a plurality of first openings and a plurality of second openings, the plurality of second openings are located in the first area, and the first opening is configured to define the light-emitting device; and a touch structure, located on a side, facing away from the substrate, of the isolation structure and comprising a touch electrode, wherein the touch electrode comprises a dummy electrode, and an orthographic projection of the first area on the substrate overlaps with an orthographic projection of the dummy electrode on the substrate.

20. The display panel according to claim 19, wherein the orthographic projection of the first area on the substrate is located within the orthographic projection of the dummy electrode on the substrate, or the orthographic projection of the dummy electrode on the substrate is located within the orthographic projection of the first area on the substrate, or an orthographic projection of at least one of the second openings on the substrate is located within an orthographic projection of an outer boundary of the dummy electrode on the substrate.

* * * * *